(12) United States Patent
Yang et al.

(10) Patent No.: US 11,895,863 B2
(45) Date of Patent: Feb. 6, 2024

(54) DISPLAY PANEL, MANUFACTURING METHOD THEREOF AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Heng Yang, Beijing (CN); Wei Li, Beijing (CN); Yanbo Zeng, Beijing (CN); Yinglong Huang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 229 days.

(21) Appl. No.: 17/486,702

(22) Filed: Sep. 27, 2021

(65) Prior Publication Data
US 2022/0102679 A1 Mar. 31, 2022

(30) Foreign Application Priority Data
Sep. 29, 2020 (CN) .......................... 202011052137.3

(51) Int. Cl.
*H10K 50/844* (2023.01)
*H10K 71/00* (2023.01)
*H10K 102/00* (2023.01)

(52) U.S. Cl.
CPC .......... *H10K 50/844* (2023.02); *H10K 71/00* (2023.02); *H10K 2102/00* (2023.02); *H10K 2102/351* (2023.02)

(58) Field of Classification Search
None
See application file for complete search history.

(56) References Cited

U.S. PATENT DOCUMENTS

2019/0252641 A1 8/2019 Zhang et al.
2021/0135160 A1* 5/2021 Sun ...................... H10K 77/111
(Continued)

FOREIGN PATENT DOCUMENTS

CN 109585676 A 4/2019
CN 109755410 A 5/2019
(Continued)

OTHER PUBLICATIONS

CN 202011052137.3 first office action.

*Primary Examiner* — Michael Lebentritt
(74) *Attorney, Agent, or Firm* — IPro, PLLC

(57) ABSTRACT

A display panel, a manufacturing method and a display device are provided. The display panel includes a substrate having a display area and a non-display area; a planarization layer covering the display area and the non-display area of the substrate; an organic light emitting element located in the display area and located at a side of the planarization layer away from the substrate; an encapsulation structure including a first inorganic layer, an organic layer and a second inorganic layer which are sequentially stacked, where the first inorganic layer and the second inorganic layer extend into a non-display area, and the first inorganic layer is arranged close to the planarization layer; and/or, a part of the planarization layer located in the non-display area is provided with a groove, and the groove is filled with a flexible water-oxidation resistant material.

18 Claims, 7 Drawing Sheets

(56) References Cited

U.S. PATENT DOCUMENTS

| | | | |
|---|---|---|---|
| 2021/0359252 A1 | 11/2021 | Wang et al. | |
| 2021/0370645 A1* | 12/2021 | Gu | B32B 37/12 |
| 2022/0140293 A1* | 5/2022 | Xia | H10K 59/352 |
| | | | 257/89 |
| 2023/0040100 A1* | 2/2023 | Qin | H10K 59/121 |
| 2023/0067641 A1* | 3/2023 | Zeng | H10K 59/879 |
| 2023/0157135 A1* | 5/2023 | Sui | H10K 59/38 |
| | | | 257/40 |

FOREIGN PATENT DOCUMENTS

| | | | | |
|---|---|---|---|---|
| CN | 109860411 A | | 6/2019 | |
| CN | 110620187 A | | 12/2019 | |
| CN | 110828700 A | | 2/2020 | |
| CN | 112259705 A | * | 1/2021 | ......... H01L 27/3244 |
| EP | 3745485 A1 | * | 12/2020 | ......... H01L 51/0018 |
| WO | WO-2020248257 A1 | * | 12/2020 | ......... H01L 27/3246 |
| WO | WO-2021212313 A1 | * | 10/2021 | ......... H01L 27/3272 |
| WO | WO-2021238926 A1 | * | 12/2021 | ......... H01L 27/3223 |

\* cited by examiner

DISPLAY PANEL, MANUFACTURING METHOD THEREOF AND DISPLAY DEVICE

CROSS-REFERENCE TO RELATED APPLICATIONS

This application claims priority to Chinese Patent Application No. 202011052137.3 filed in China on Sep. 29, 2020, the entire contents of which are incorporated herein by reference.

TECHNICAL FIELD

The present disclosure relates to the technical field of display, in particular to a display panel, a manufacturing method thereof and a display device.

BACKGROUND

Organic light emitting display devices (OLEDs) are increasingly favored by users due to their light, thin, high brightness, low power consumption, fast response, high definition, good flexibility, and high luminous efficiency. With the development of display device requirements, the quality and lifetime requirements of OLED devices are more and more stringent, and thus the packaging performance requirements of OLED devices are also more and more stringent. Currently, encapsulation structures are typically formed by thin film encapsulation to prevent water vapor and oxygen from penetrating into the display device.

However, there is still a need for improvements in organic light emitting display devices.

SUMMARY

In one aspect of the present disclosure, a display panel is provided. The display panel includes: a substrate having a display area and a non-display area; a planarization layer covering the display area and the non-display area of the substrate; an organic light emitting element located in the display area and located at a side of the planarization layer away from the substrate; an encapsulation structure wrapping the organic light emitting element, where the encapsulation structure includes a first inorganic layer, an organic layer and a second inorganic layer which are sequentially stacked, the first inorganic layer and the second inorganic layer extend into the non-display area, the first inorganic layer is arranged close to the planarization layer; where the display panel includes a third inorganic layer, and the third inorganic layer is located in the non-display area and is located between the planarization layer and the first inorganic layer; and/or a part of the planarization layer located in the non-display area is provided with a groove, and the groove is filled with a flexible water-oxidation resistant material.

Optionally, the materials constituting the first inorganic layer, the second inorganic layer, and the third inorganic layer each independently include at least one of silicon oxide, silicon nitride, and silicon oxynitride.

Optionally, the water vapor transmission rate of the third inorganic layer is less than the water vapor transmission rate of the first inorganic layer.

Optionally, the third inorganic layer has a thickness of 0.1-1 µm.

Optionally, an orthographic projection of the third inorganic layer on the substrate coincides with an orthographic projection of a part of the planarization layer located in the non-display area on the substrate.

Optionally, the flexible water-oxidation resistant material includes at least one of polyvinyl fluoride, polyvinylidene fluoride, polytetrafluoroethylene, fluorocarbon resin, and silicone rubber.

Optionally, the groove penetrates through the planarization layer in a thickness direction of the planarization layer.

Optionally, it further includes a fourth inorganic layer located in the display area and between the first inorganic layer and the organic layer, and the roughness of the fourth inorganic layer is greater than that of the first inorganic layer.

In another aspect of the present disclosure, a method for manufacturing a display panel is provided. The method includes: providing a substrate having a display area and a non-display area; forming a planarization layer on a display area and a non-display area of the substrate; forming an organic light emitting element on a side of the planarization layer away from the substrate, where the organic light emitting element is located in the display area; forming an encapsulation structure wrapping the organic light emitting element, where the encapsulation structure includes a first inorganic layer, an organic layer and a second inorganic layer which are sequentially stacked, the first inorganic layer and the second inorganic layer extend into the non-display area, and the first inorganic layer is arranged close to the planarization layer; where the method further includes: forming a third inorganic layer, causing that the third inorganic layer is located in the non-display area and is located between the planarization layer and the first inorganic layer; and/or, providing a groove in a part of the planarization layer located in the non-display area, and filling the groove with a flexible water-oxidation resistant material.

Optionally, the water vapor transmission rate of the third inorganic layer is less than the water vapor transmission rate of the first inorganic layer.

Optionally, an orthographic projection of the third inorganic layer formed on the substrate coincides with an orthographic projection of a part of the planarization layer located in the non-display area on the substrate.

Optionally, the groove is formed by patterning the planarization layer through a predetermined mask.

Optionally, after providing the first inorganic layer, the method further includes before providing the organic layer: forming a fourth inorganic layer in the display area, where the roughness of the fourth inorganic layer is greater than that of the first inorganic layer.

In another aspect of the present disclosure, a display device is provided. The display device includes a display panel;

where the display panel includes:
a substrate having a display area and a non-display area;
a planarization layer covering the display area and the non-display area of the substrate;
an organic light emitting element located in the display area and located at a side of the planarization layer away from the substrate;
an encapsulation structure wrapping the organic light emitting element, where the encapsulation structure includes a first inorganic layer, an organic layer and a second inorganic layer which are sequentially stacked, the first inorganic layer and the second inorganic layer extend into the non-display area, and the first inorganic layer is arranged close to the planarization layer;

where the display panel includes a third inorganic layer, and the third inorganic layer is located in the non-display area and is located between the planarization layer and the first inorganic layer; and/or a part of the planarization layer located in the non-display area is provided with a groove, and the groove is filled with a flexible water-oxidation resistant material.

Optionally, the materials constituting the first inorganic layer, the second inorganic layer, and the third inorganic layer each independently include at least one of silicon oxide, silicon nitride, and silicon oxynitride.

Optionally, the water vapor transmission rate of the third inorganic layer is less than the water vapor transmission rate of the first inorganic layer.

Optionally, the third inorganic layer has a thickness of 0.1-1 μm.

Optionally, an orthographic projection of the third inorganic layer on the substrate coincides with an orthographic projection of a part of the planarization layer located in the non-display area on the substrate.

Optionally, the flexible water-oxidation resistant material includes at least one of polyvinyl fluoride, polyvinylidene fluoride, polytetrafluoroethylene, fluorocarbon resin, and silicone rubber.

Optionally, the groove penetrates through the planarization layer in a thickness direction of the planarization layer.

BRIEF DESCRIPTION OF THE DRAWINGS

The foregoing and/or additional aspects and advantages of the present disclosure will be apparent from and elucidated with reference to the embodiments described hereinafter with reference to the accompanying drawings, in which.

DETAILED DESCRIPTION

Figure 1:
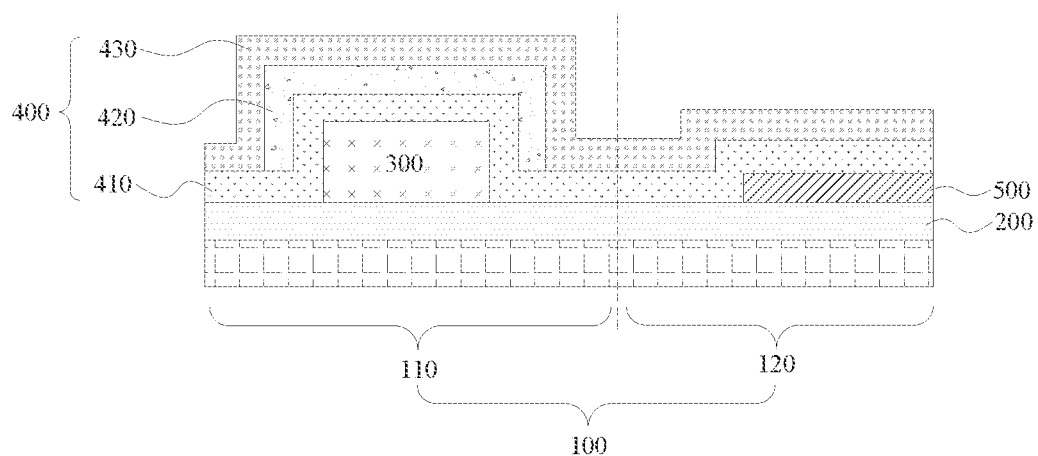
FIG. 1 shows a schematic structural diagram of a display panel according to one embodiment of the present disclosure.

Reference will now be made in detail to the embodiments of the present disclosure, examples of which are illustrated in the accompanying drawings, where like or similar reference numerals refer to the same or similar elements throughout or elements having the same or similar function. The embodiments described below by reference to the drawings are exemplary only for the purpose of illustrating the disclosure and are not to be construed as limiting the disclosure.

In one aspect of the present disclosure, a display panel is presented. In accordance with an embodiment of the present disclosure, referring to FIG. 1, the display panel includes: the organic light emitting device includes a substrate 100, a planarization layer 200, an organic light emitting element 300 and an encapsulation structure 400, where the substrate 100 is provided with a display area 110 and a non-display area 120, the planarization layer 200 covers the display area 110 and the non-display area 120 of the substrate 100, the organic light emitting element 300 is located in the display area 110, and the planarization layer 200 is located away from the substrate 100. The encapsulation structure 400 includes a first inorganic layer 410, an organic layer 420 and a second inorganic layer 430 which are sequentially stacked, the first inorganic layer 410 and the second inorganic layer 430 extend into the non-display area 120, the first inorganic layer 410 is arranged close to the planarization layer 200, and the display panel satisfies at least one of the following conditions: including a third inorganic layer 500 located in the non-display area 120 and located between the planarization layer 200 and the first inorganic layer 410; the part of the planarization layer 200 located in the non-display area 120 has a groove filled with a flexible water-oxidation resistant material 210. Therefore, the problem that the lateral packaging effect is poor can be effectively relieved, the packaging effect is improved, the service life of the display panel is prolonged, the optical effect of the display area is guaranteed, the encapsulation structure in the display panel can be a thinned encapsulation structure due to the fact that the packaging performance is improved, and the display panel is light and thin.

To facilitate understanding, a display panel according to an embodiment of the present disclosure is first briefly described as follows:

As described above, the encapsulation structure in the display panel is generally a thinned encapsulation structure at present, however, the thinned encapsulation structure increases the risk of intrusion of water and oxygen from the lateral direction and affects the service life of the display panel. Specifically, the current encapsulation structure includes a first inorganic layer, an organic layer and a second inorganic layer which are sequentially stacked, where the first inorganic layer and the second inorganic layer extend into the non-display area, the first inorganic layer is arranged close to the planarization layer, the part, located in the non-display area, of the first inorganic layer is in contact with the part, located in the non-display area, of the planarization layer, and the planarization layer can absorb water and oxidize the first inorganic layer; and water oxygen is caused to laterally invade along the encapsulation structure to influence the packaging effect.

In the present disclosure, the display panel includes a third inorganic layer 500 located in the non-display area 120 and located between the first inorganic layer 410 and the planarization layer 200. Therefore, the third inorganic layer can effectively alleviate the oxidation of the first inorganic layer caused by lateral water absorption of the planarization layer, so that the problem of poor lateral packaging effect is solved, the water and oxygen resistance of the encapsulation structure is improved, and the service life of the display panel is prolonged.

Optionally, the part of the planarization layer 200 located in the non-display area 120 is provided with a groove, and the groove is filled with the flexible water-oxidation resistant material 210, so that the path of oxidation of the first inorganic layer caused by water absorption of the planarization layer can be cut off, the problem of poor lateral packaging effect is solved, the packaging effect of the encapsulation structure is improved, and the flexible water-oxidation resistant material is located in the non-display area, so that the optical effect of the display area is not influenced. moreover, the toughness of the non-display area can be improved, and the bending requirement of the non-display area is better met.

According to some embodiments of the present disclosure, and with reference to FIG. 1, the display panel includes a third inorganic layer 500 located only in the non-display area 120 and between the first inorganic layer 410 and the planarizing layer 200, which may not be filled with a flexible water-oxidation resistant material. Therefore, the problem of poor lateral packaging effect can be relieved, the water and oxygen resistance of the encapsulation structure is improved, and the service life of the display panel is prolonged.

Figure 2:
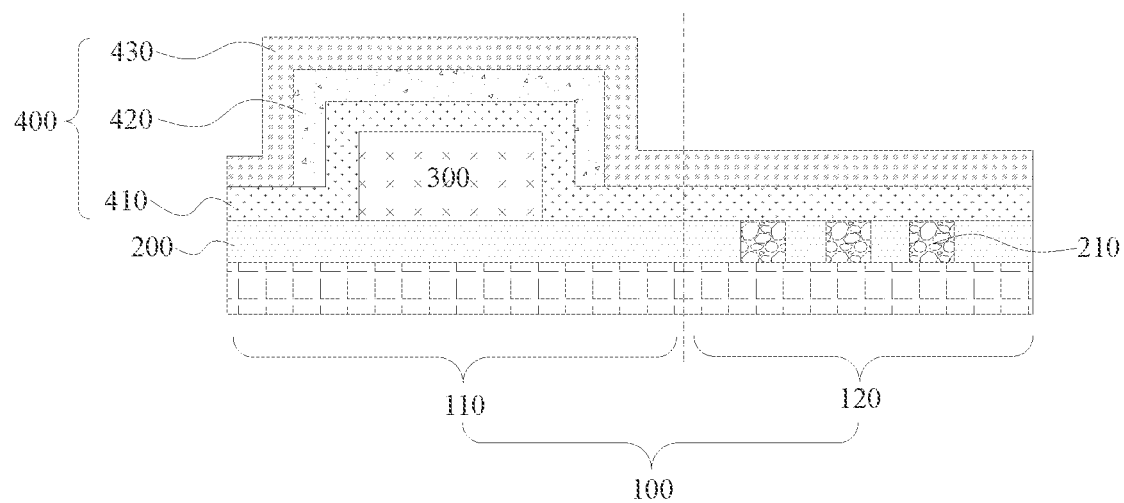
FIG. 2 shows a schematic structural diagram of a display panel according to another embodiment of the present disclosure.

According to further embodiments of the present disclosure, and referring to FIG. 2, the display panel does not include a third inorganic layer, a part of the planarization layer 200 located in the non-display area 120 has a groove filled with a flexible water-oxidation resistant material 210. Therefore, the problem of poor lateral packaging effect can be relieved, the water and oxygen resistance of the encapsulation structure is improved, the service life of the display panel is prolonged, and the toughness of the non-display area can be improved.

Figure 3:
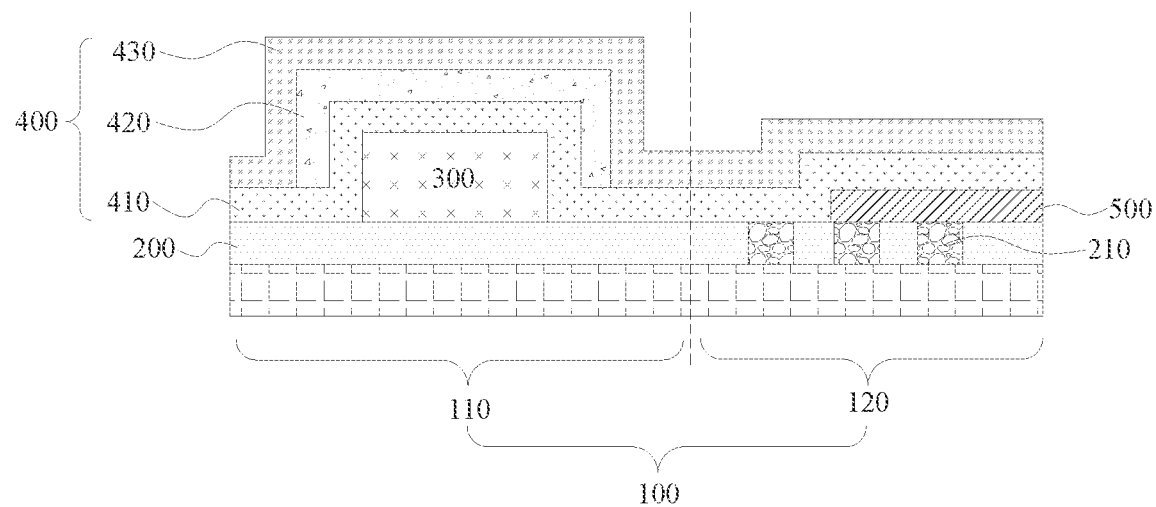
FIG. 3 shows a schematic structural diagram of a display panel according to another embodiment of the present disclosure.

According to further embodiments of the present disclosure, and with reference to FIG. 3, the display panel includes a third inorganic layer 500 located only in the non-display area 120 and located between the first inorganic layer 410 and the planarizing layer 200, while portions of the planarizing layer 200 located in the non-display area 120 have grooves filled with the flexible water-oxidation resistant material 210. Therefore, the problem of poor lateral packaging effect can be further relieved, the water and oxygen resistance of the encapsulation structure is further improved, the service life of the display panel is prolonged, and the toughness of the non-display area can be improved.

It should be noted that the package structure in the present disclosure may be a thinned package structure, or may be a pre-thinned package structure. That is, the present disclosure is applicable to encapsulation of organic light emitting elements and is not limited to thinned encapsulation structures.

The specific thicknesses of the first inorganic layer, the organic layer and the second inorganic layer in the encapsulation structure are not particularly limited, and a person skilled in the art would be able to design according to the common thicknesses of the first inorganic layer, the organic layer and the second inorganic layer in the conventional encapsulation structure.

According to embodiments of the present disclosure, both the first inorganic layer 410 and the second inorganic layer 430 in the encapsulation structure 400 extend into the non-display area 120, and the organic layer 420 may be located only in the display area 110.

Various structures of the display panel are described in detail below in accordance with specific embodiments of the present disclosure:

According to an embodiment of the present disclosure, the materials constituting the first inorganic layer 410, the second inorganic layer 430, and the third inorganic layer 500 may each independently include at least one of silicon oxide, silicon nitride, and silicon oxynitride. The material has good water and oxygen resistance, can prevent water and oxygen from entering the organic light emitting element, and can prevent impurities from diffusing between the substrate and the organic light emitting element.

According to embodiments of the present disclosure, the third inorganic layer 500 has a water vapor transmission rate (WVTR) that is less than the water vapor transmission rate of the first inorganic layer 410. Therefore, compared with the first inorganic layer, the third inorganic layer has better water and oxygen resistance, further solves the problem of poor lateral packaging effect, and further improves the packaging effect.

The specific materials regarding the first inorganic layer and the third inorganic layer are not particularly limited as long as the above conditions are satisfied, for example, according to a specific embodiment of the present disclosure, the third inorganic layer 500 may be composed of silicon nitride and the first inorganic layer 410 may be composed of silicon oxynitride.

According to embodiments of the present disclosure, the third inorganic layer 500 may have a thickness of 0.1-1 µm, such as 0.1 µm, 0.2 µm, 0.3 µm, 0.4 µm, 0.5 µm, 0.6 µm, 0.7 µm, 0.8 µm, 0.9 µm, 1 µm. Therefore, the third inorganic layer has good water and oxygen resistance, has a thin thickness, and does not significantly increase the overall thickness of the display panel.

Figure 4:
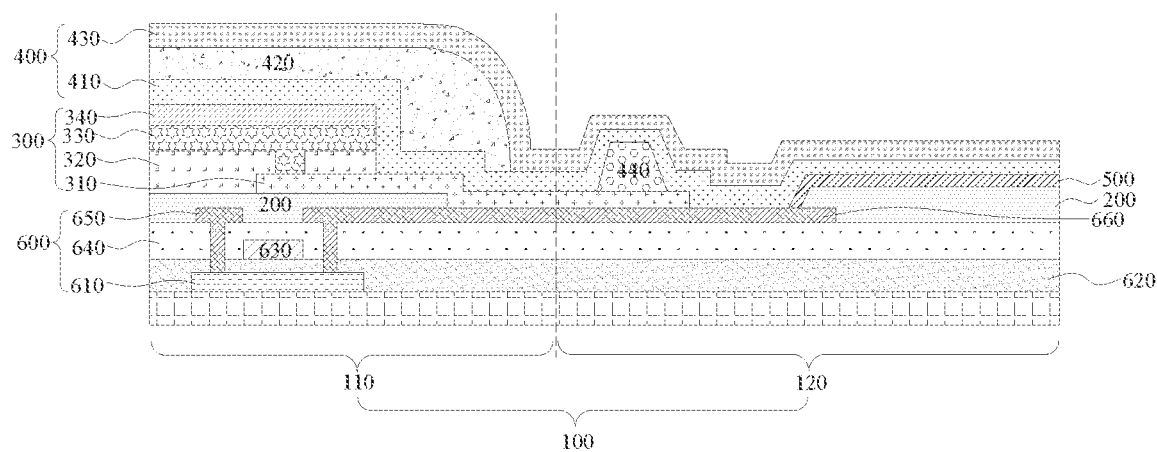
FIG. 4 shows a schematic structural diagram of a display panel according to another embodiment of the present disclosure.

According to an embodiment of the present disclosure, referring to FIG. 4, the orthographic projection of the third inorganic layer 500 onto the substrate 100 may coincide with the orthographic projection of the part of the planarization layer 200 located in the non-display area 120 onto the substrate 100. Therefore, the third inorganic layer can completely cover the part, located in the non-display area, of the planarization layer, so that the water and oxygen resistance of the encapsulation structure is further improved.

Figure 6:
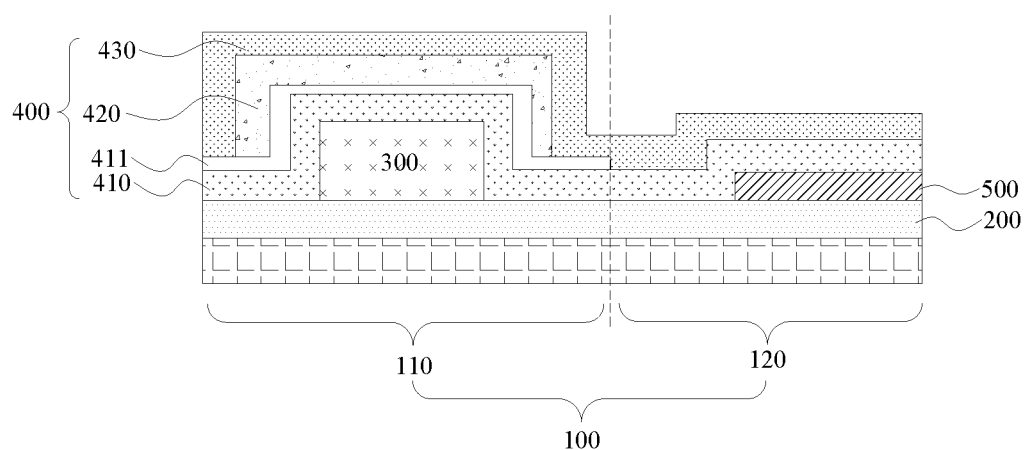
FIG. 6 shows a schematic structural diagram of a display panel according to another embodiment of the present disclosure.

According to an embodiment of the present disclosure, referring to FIG. 6, the display panel may further include a fourth inorganic layer 411. The fourth inorganic layer 411 is located in the display area 110 between the first inorganic layer 410 and the organic layer 420. Specifically, the roughness of the fourth inorganic layer 411 can be made greater than that of the first inorganic layer 410 by controlling the material from which the fourth inorganic layer 411 is formed, so that the leveling of the organic layer 420 on the surface of the fourth inorganic layer 411 can be facilitated, the quality of the formed organic layer 420 can be improved, and the probability of forming an orange peel or the like can be reduced. Also, the fourth inorganic layer 411 is located only in the display area, so that the material forming the organic layer 420 can be prevented from flowing to the non-display area to cause defects.

Specifically, the fourth inorganic layer 411 may be formed of silicon oxynitride. The fourth inorganic layer 411 may be deposited after deposition to form the first inorganic layer 410. The stacked structure formed by the silicon oxynitride material and the materials forming the first inorganic layer and the second inorganic layer together has an appropriate refractive index, so that the addition of the fourth inorganic layer 411 can prevent the organic layer 420 from flowing to the non-display area during the formation process without affecting the light emission of the organic light emitting element.

According to an embodiment of the present disclosure, a part of the planarization layer 200 located in the non-display area 120 has grooves filled with a flexible water-oxidation resistant material 210, which may include at least one of polyvinyl fluoride (PVF), polyvinylidene fluoride (PVDF), polytetrafluoroethylene (PTFE), fluorocarbon resin (FEVE), and silicone rubber. The material has high toughness and good water and oxygen resistance, so that the path of water and oxygen laterally invading from the planarization layer can be effectively blocked, and the packaging effect is improved.

According to embodiments of the present disclosure, the depth of the grooves in the planarization layer 200 may be less than the thickness of the planarization layer 200, and optionally, the groove in the planarization layer 200 penetrates through the planarization layer 200 in a thickness direction of the planarization layer 200, where by a path of lateral intrusion of water and oxygen from the planarization layer may be significantly blocked, and a packaging effect may be significantly improved.

Figure 5:
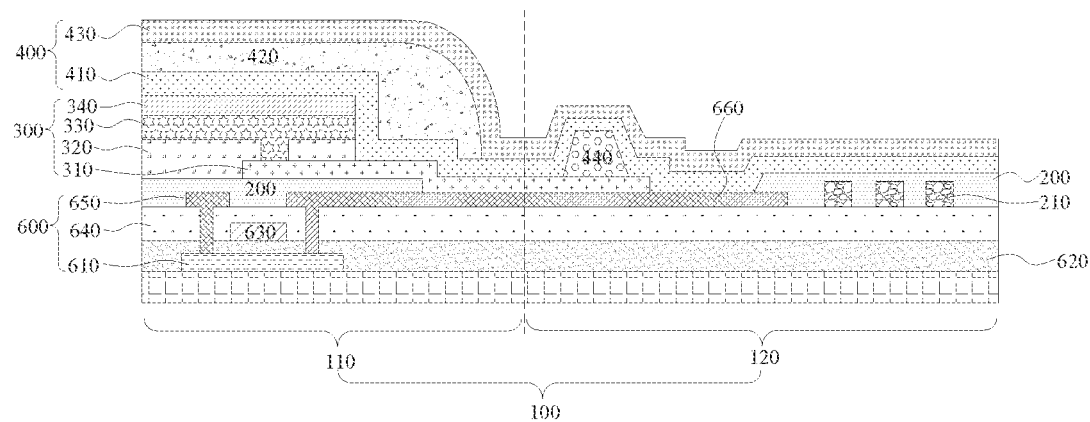
FIG. 5 shows a schematic structural diagram of a display panel according to another embodiment of the present disclosure.

According to an embodiment of the present disclosure, referring to FIGS. 4 and 5, the display area 110 of the display panel has a thin film transistor 600 including an active layer 610, a gate insulating layer 620, a gate electrode 630, an interlayer insulating layer 640, and a source and drain electrodes which are sequentially stacked, the active layer 610 being close to the substrate 10 The source and drain electrodes 650 and 660 are connected to the active layer 610 through vias penetrating through the interlayer insulating layer 640, and the vias penetrating through the interlayer insulating layer 640 extend into the gate insulating layer 620, and the planarization layer 200 is located on the side of the source and drain electrodes away from the interlayer insulating layer 640.

According to an embodiment of the present disclosure, referring to FIGS. 4 and 5, an organic light emitting element 300 includes an anode 310 disposed adjacent to a planarization layer 200 and connected to a drain electrode 660, a pixel defining layer 320, an organic functional layer 330, and a cathode 340 sequentially stacked, and the organic functional layer 330 is connected to the anode 310 through a via hole penetrating through the pixel defining layer 320. The specific structure with respect to the organic functional layer is not particularly limited, for example, the organic functional layer 330 may include all or part of a hole injection layer, a hole transport layer, an electron blocking layer, a light emitting layer, a hole blocking layer, an electron transport layer, an electron injection layer, and its light emitting layer may be a red, green, blue three-color light emitting layer or a white light emitting layer.

According to an embodiment of the present disclosure, referring to FIGS. 4 and 5, the package structure 400 may further include a dam 440 located in the non-display area 120, and both the first inorganic layer 410 and the second inorganic layer 430 cover the dam 440. Therefore, the packaging effect of the encapsulation structure can be further improved.

It should be specifically noted herein that the dams 440 in FIGS. 4 and 5 of the present disclosure are intended only to illustrate the location of the dams for ease of understanding and are not to be construed as limiting the number and shape of the dams. Specifically, the dam may have a trapezoidal cross-section, and the display panel may have a plurality of sequentially surrounding dams, such as two, three, four, and five dams surrounding the display area, to ensure the packaging effect of the encapsulation structure.

In another aspect of the present disclosure, a method for manufacturing a display panel is presented. According to an embodiment of the present disclosure, the display panel manufactured by the method may be a previously described display panel, and thus, the display panel manufactured by the method may have the same features and advantages as those of the previously described display panel, which will not be described in detail herein.

Figure 7:
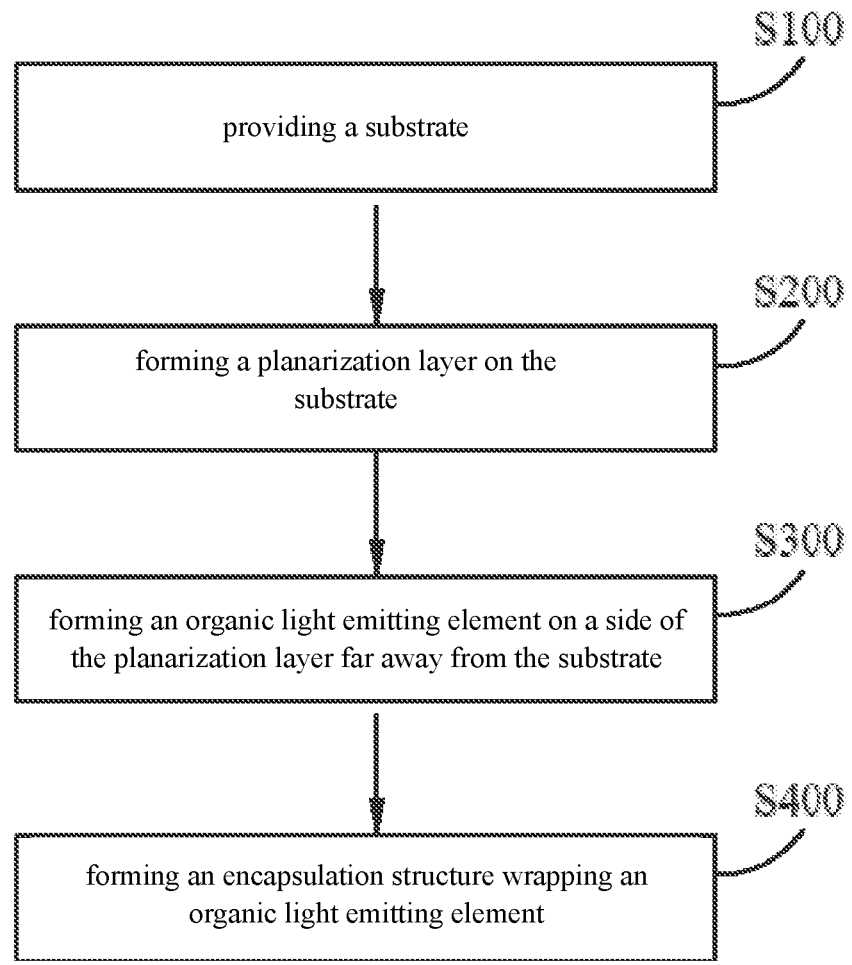
FIG. 7 shows a flow diagram of a method for manufacturing a display panel in accordance with one embodiment of the present disclosure.

Referring to FIG. 7, according to an embodiment of the present disclosure, the method includes:

S100: providing a substrate

In this step, a substrate is provided. According to embodiments of the present disclosure, a substrate has a display area and a non-display area. The constituent materials of the substrate are not particularly limited, and a person skilled in the art would be able to design according to common materials of the substrate in the display panel.

According to an embodiment of the present disclosure, in this step, a thin film transistor is formed in a display area of the substrate, and the organic light emitting element is controlled to emit light through the thin film transistor for display. The structure of the thin film transistor has been described in detail above, and will not be described in detail here. With regard to the formation process of each film layer in the thin film transistor being not particularly limited, a person skilled in the art would be able to design according to common formation processes of thin film transistors.

S200: forming a planarization layer on the substrate

In this step, a planarization layer is formed on the substrate. According to the embodiment of the present disclosure, the planarization layer covers the display area and the non-display area of the substrate, specifically, the planarization layer is located on the side, away from the substrate, of the thin film transistor and provides a flat surface for the subsequent organic light emitting element.

The material constituting the planarization layer is not particularly limited, and a person skilled in the art would be able to design according to common materials of the planarization layer.

According to embodiments of the present disclosure, the planarization layer formed in this step may be a monolithic structure, or the part of the planarization layer located in the non-display area may have a groove filled with a flexible water-oxidation resistant material. The planarization layer filled with the flexible water-oxidation resistant material can be formed by the following steps: after forming an entire planarization layer on the substrate, the part of the planarization layer located in the non-display area may be patterned on the basis of a predetermined mask to form a groove, and then the groove is filled with a flexible water-oxidation resistant material to form the planarization layer having the flexible water-oxidation resistant material. Therefore, the flexible water oxygen resistant material in the flattening layer can cut off the path of lateral invasion of water oxygen from the flattening layer, the packaging effect is improved, the flexible water oxygen resistant material is located in the non-display area, the optical effect of the display area is not influenced, and the bending performance of the non-display area can be improved. The specific manner regarding the patterning process is not particularly limited, for example, grooves may be formed in the planarization layer by an etching process. Specific materials for the flexible water-oxidation resistant material have been described in detail above and will not be described in detail herein.

It should be noted that "the planarization layer is a monolithic structure" means that no grooves are provided in the planarization layer, nor are the grooves filled with a flexible water-oxidation resistant material.

S300: forming an organic light emitting element on a side of the planarization layer away from the substrate In this step, an organic light emitting element is formed on a side of the planarization layer away from the substrate. According to an embodiment of the present disclosure, an organic light emitting element is located in a display area, and the organic light emitting element may include an anode, a pixel defining layer, an organic functional layer, and a cathode which are sequentially stacked, the anode being disposed adjacent to the planarization layer. With regard to the specific materials and forming processes of the anode, the pixel defining layer, the organic functional layer and the cathode being not particularly limited, a person skilled in the art would be able to design the same according to the common materials and common forming processes of the above-mentioned film layer.

S400: forming an encapsulation structure wrapping an organic light emitting element In this step, an encapsulation structure surrounding the organic light emitting element is formed. According to an embodiment of the present disclosure, an encapsulation structure may include a first inorganic layer, an organic layer, and a second inorganic layer sequentially stacked, the first inorganic layer and the second inorganic layer extending into a non-display area, and the first inorganic layer disposed adjacent to the planarization layer. As to the constituent materials of the first inorganic layer and the second inorganic layer, the foregoing has been described in detail and will not be described in detail herein. With regard to the formation process of the first inorganic layer, the second inorganic layer and the organic layer, it is not particularly limited, and a person skilled in the art would be able to design according to the conventional formation process of the above-mentioned film layer.

According to an embodiment of the present disclosure, in this step, further including: a third inorganic layer is formed, the third inorganic layer being located in the non-display area and between the planarization layer and the first inorganic layer. The third inorganic layer may be formed by: before forming the first inorganic layer, a third inorganic layer is formed on a portion where the planarization layer is located in the non-display area, and then the first inorganic layer is formed such that the third inorganic layer is located between the planarization layer and the first inorganic layer. Therefore, the third inorganic layer can effectively alleviate the oxidation of the first inorganic layer caused by lateral water absorption of the planarization layer, so that the problem of poor lateral packaging effect is solved, the water and oxygen resistance of the encapsulation structure is improved, and the service life of the display panel is prolonged. The formation process with respect to the third inorganic layer is not particularly limited, for example, the same formation process as that of the first inorganic layer and the second inorganic layer may be employed. As to the constitution material and the thickness of the third inorganic layer, the foregoing has been described in detail and will not be described in detail.

According to embodiments of the present disclosure, the water vapor transmission rate of the third inorganic layer is less than the water vapor transmission rate of the first inorganic layer. Therefore, compared with the first inorganic layer, the third inorganic layer has better water and oxygen resistance, further solves the problem of poor lateral packaging effect, and further improves the packaging effect.

According to embodiments of the present disclosure, the orthographic projection of the third inorganic layer formed on the substrate may coincide with the orthographic projection of the part of the planarization layer located in the non-display area on the substrate. Therefore, the third inorganic layer can completely cover the part, located in the non-display area, of the planarization layer, so that the water and oxygen resistance of the encapsulation structure is further improved.

According to embodiments of the present disclosure, a fourth inorganic layer may be further formed in the display area after forming the first inorganic layer and before forming the organic layer. Specifically, the fourth inorganic layer may be formed by a deposition process, the roughness of the fourth inorganic layer being greater than the roughness of the first inorganic layer. The materials, locations and principles of operation of the fourth inorganic layer have been described in detail above and will not be described in detail herein. In general, by adding the fourth inorganic layer, the quality of the formed organic layer can be further improved, an organic layer with a relatively thin thickness and a relatively good flatness can be formed while ensuring that the light output of the display panel is not affected, and the probability that the organic layer flows to a non-display area to cause defects is reduced.

According to the embodiment of the present disclosure, the encapsulation structure in the display panel can be a thinned encapsulation structure or a pre-thinned encapsulation structure, that is, the encapsulation used for the organic light emitting element in the present disclosure is suitable and not limited to the thinned encapsulation structure, so that the two display panels have high water-oxygen stability, thereby prolonging the service life of the display panel.

According to an embodiment of the present disclosure, in forming a display panel, a groove may be formed in a portion where a planarization layer is located in a non-display area, and a flexible water-oxygen barrier material is filled in the groove, and then a third inorganic layer may not be formed before forming an encapsulation structure.

Optionally, when the planarization layer is formed, an entire planarization layer is formed, that is, the planarization layer does not have a groove therein, a third inorganic layer is formed on a portion where the planarization layer is located in the non-display area before the encapsulation structure is subsequently formed, and then the encapsulation structure is formed so that the third inorganic layer is located between the first inorganic layer and the planarization layer.

Optionally, in forming the planarization layer, a groove is formed in a portion where the planarization layer is located in the non-display area, and the groove is filled with the flexible water-oxidation resistant material, and a third inorganic layer is formed on a portion where the planarization layer is located in the non-display area before subsequently forming the encapsulation structure, and then the encapsulation structure is formed so that the third inorganic layer is located between the first inorganic layer and the planarization layer.

In another aspect of the present disclosure, a display device is provided. According to an embodiment of the present disclosure, the display device includes a display panel as previously described. Thus, the display device has all the features and advantages of the previously described display panel, which will not be described in detail herein. In general, the display device has high water-oxygen stability and long service life.

In the description of the present disclosure, the terms "upper, lower", and the like indicate orientations or positional relationships that are based on the orientations or positional relationships shown in the drawings for purposes of describing the present disclosure only and are not intended to require that the present disclosure be constructed and operated in a particular orientation and, therefore, should not be construed as limiting the present disclosure.

In the description of this specification, reference to the terms "one embodiment, another embodiment", and the like, means that a particular feature, structure, material, or characteristic described in connection with the embodiment is included in at least one embodiment of the disclosure. In the present specification, schematic representations of the above terms are not necessarily directed to the same embodiments or examples. Furthermore, the particular features, structures, materials, or characteristics described may be combined in any one or more embodiments or examples in a suitable manner. Moreover, various embodiments or examples described in this specification, as well as features of various embodiments or examples, may be combined and combined by those skilled in the art without departing from the scope of the present disclosure. In addition, it should be noted that in the present description, the terms "first" and "second" are used for descriptive purposes only and are not to be construed as indicating or implying relative importance or implicitly indicating the number of technical features indicated.

While embodiments of the present disclosure have been shown and described above, it is to be understood that the above-described embodiments are illustrative and not restrictive of the disclosure, as variations, modifications, substitutions and variations of the above-described embodiments may occur to those of ordinary skill in the art within the scope of the disclosure.

What is claimed is:

1. A display panel, comprising:
a substrate having a display area and a non-display area;
a planarization layer covering the display area and the non-display area of the substrate;
an organic light emitting element located in the display area and located at a side of the planarization layer away from the substrate;
an encapsulation structure wrapping the organic light emitting element, wherein the encapsulation structure comprises a first inorganic layer, an organic layer and a second inorganic layer which are sequentially stacked, the first inorganic layer and the second inorganic layer extend into the non-display area, and the first inorganic layer is arranged close to the planarization layer;
wherein the display panel further comprises:
a third inorganic layer, wherein the third inorganic layer is located in the non-display area and is located between the planarization layer and the first inorganic layer; and/or
a part of the planarization layer located in the non-display area is provided with a groove, and the groove is filled with a flexible water-oxidation resistant material;
wherein the display panel further comprises a fourth inorganic layer located in the display area and between the first inorganic layer and the organic layer, and a roughness of the fourth inorganic layer is greater than a roughness of the first inorganic layer.

2. The display panel according to claim 1, wherein materials constituting the first inorganic layer, the second inorganic layer, and the third inorganic layer each independently comprise at least one of silicon oxide, silicon nitride, and silicon oxynitride.

3. The display panel according to claim 1, wherein a water vapor transmission rate of the third inorganic layer is less than a water vapor transmission rate of the first inorganic layer.

4. The display panel according to claim 1, wherein the third inorganic layer has a thickness of 0.1-1 µm.

5. The display panel according to claim 1, wherein an orthographic projection of the third inorganic layer on the substrate coincides with an orthographic projection of a part of the planarization layer located in the non-display area on the substrate.

6. The display panel according to claim 1, wherein the flexible water-oxidation resistant material comprises at least one of polyvinyl fluoride, polyvinylidene fluoride, polytetrafluoroethylene, fluorocarbon resin, and silicone rubber.

7. The display panel according to claim 1, wherein the groove penetrates through the planarization layer in a thickness direction of the planarization layer.

8. A method for manufacturing a display panel, comprising:
providing a substrate having a display area and a non-display area;
forming a planarization layer on the display area and the non-display area of the substrate;
forming an organic light emitting element on a side of the planarization layer away from the substrate, wherein the organic light emitting element is located in the display area;
forming an encapsulation structure wrapping the organic light emitting element, wherein the encapsulation structure comprises a first inorganic layer, an organic layer and a second inorganic layer which are sequentially stacked, the first inorganic layer and the second inorganic layer extend into the non-display area, and the first inorganic layer is arranged close to the planarization layer;
wherein the method further comprises:
forming a third inorganic layer, causing that the third inorganic layer is located in the non-display area and is located between the planarization layer and the first inorganic layer; and/or
providing a groove in a part of the planarization layer located in the non-display area, and filling the groove with a flexible water-oxidation resistant material;
wherein subsequent to the providing the first inorganic layer and prior to the providing the organic layer, the method further comprises:
forming a fourth inorganic layer in the display area, wherein a roughness of the fourth inorganic layer is greater than a roughness of the first inorganic layer.

9. The method according to claim 8, wherein a water vapor transmission rate of the third inorganic layer is less than a water vapor transmission rate of the first inorganic layer.

10. The method according to claim 8, wherein an orthographic projection of the third inorganic layer formed on the substrate coincides with an orthographic projection of a part of the planarization layer in the non-display area on the substrate.

11. The method according to claim 8, wherein the groove is formed by patterning the planarization layer through a predetermined mask.

12. A display device, comprising a display panel;
wherein the display panel comprises:
a substrate having a display area and a non-display area;
a planarization layer covering the display area and the non-display area of the substrate;
an organic light emitting element located in the display area and located at a side of the planarization layer away from the substrate;
an encapsulation structure wrapping the organic light emitting element, wherein the encapsulation structure comprises a first inorganic layer, an organic layer and a second inorganic layer which are sequentially stacked, the first inorganic layer and the second inorganic layer extend into the non-display area, and the first inorganic layer is arranged close to the planarization layer;

wherein the display panel comprises a third inorganic layer, and the third inorganic layer is located in the non-display area and is located between the planarization layer and the first inorganic layer; and/or a part of the planarization layer located in the non-display area is provided with a groove, and the groove is filled with a flexible water-oxidation resistant material;

wherein the display panel further comprises a fourth inorganic layer located in the display area and between the first inorganic layer and the organic layer, and a roughness of the fourth inorganic layer is greater than a roughness of the first inorganic layer.

13. The display device according to claim 12, wherein materials constituting the first inorganic layer, the second inorganic layer, and the third inorganic layer each independently comprise at least one of silicon oxide, silicon nitride, and silicon oxynitride.

14. The display device according to claim 12, wherein a water vapor transmission rate of the third inorganic layer is less than a water vapor transmission rate of the first inorganic layer.

15. The display device according to claim 12, wherein the third inorganic layer has a thickness of 0.1-1 µm.

16. The display device according to claim 12, wherein an orthographic projection of the third inorganic layer on the substrate coincides with an orthographic projection of a part of the planarization layer located in the non-display area on the substrate.

17. The display device according to claim 12, wherein the flexible water-oxidation resistant material comprises at least one of polyvinyl fluoride, polyvinylidene fluoride, polytetrafluoroethylene, fluorocarbon resin, and silicone rubber.

18. The display device according to claim 12, wherein the groove penetrates through the planarization layer in a thickness direction of the planarization layer.

* * * * *